US011921552B2

(12) United States Patent
Chen et al.

(10) Patent No.: US 11,921,552 B2
(45) Date of Patent: Mar. 5, 2024

(54) HIGH EFFICIENCY JET FLOW GENERATOR FOR STORAGE COOLING

(71) Applicant: Quanta Computer Inc., Taoyuan (TW)

(72) Inventors: Chao-Jung Chen, Taoyuan (TW); Yu-Nien Huang, Taoyuan (TW); Jen-Hui Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 63 days.

(21) Appl. No.: 17/825,836

(22) Filed: May 26, 2022

(65) Prior Publication Data

US 2023/0276594 A1 Aug. 31, 2023

Related U.S. Application Data

(60) Provisional application No. 63/314,691, filed on Feb. 28, 2022.

(51) Int. Cl.
*H05K 7/20* (2006.01)
*G06F 1/18* (2006.01)
*G06F 1/20* (2006.01)

(52) U.S. Cl.
CPC .............. *G06F 1/20* (2013.01); *G06F 1/187* (2013.01); *G06F 1/206* (2013.01); *H05K 7/20145* (2013.01)

(58) Field of Classification Search
CPC ........ H05K 7/20145; G06F 1/20; G06F 1/187
See application file for complete search history.

(56) References Cited

U.S. PATENT DOCUMENTS

| 4,176,876 A * | 12/1979 | Sorensen ................... B60J 7/22 |
| | | 296/217 |
| 8,743,549 B2 * | 6/2014 | Frink ....................... G06F 1/20 |
| | | 361/679.5 |
| 11,553,626 B2 * | 1/2023 | Beall .................... G11B 33/128 |
| 2003/0128517 A1 | 7/2003 | Faneuf et al. |

(Continued)

FOREIGN PATENT DOCUMENTS

| CN | 113157070 A | 7/2021 |
| TW | M619809 U | 11/2021 |

OTHER PUBLICATIONS

TW Office Action for Application No. 111126664, dated Dec. 2, 2022, w/ First Office Action Summary.

(Continued)

*Primary Examiner* — Zachary Pape
(74) *Attorney, Agent, or Firm* — NIXON PEABODY LLP

(57) ABSTRACT

A computer chassis includes walls defining an airspace containing heat-generating components (e.g., storage drives). The airspace is divided into first and second regions, such as by a printed circuit board supporting the heat-generating components within the first region. An air input feeds both the first region and second region. Input air going through the first region first passes by a forward set of heat-generating components before continuing to a rearward set of heat-generating components to extract heat therefrom. Input air going through the second region bypasses the forward set of heat-generating components before being directed out through an air opening partway down the length of the chassis, after which this air passes by a rearward set of heat-generating components to extract heat.

20 Claims, 6 Drawing Sheets

(56) References Cited

U.S. PATENT DOCUMENTS

| | | | | |
|---|---|---|---|---|
| 2006/0120043 A1* | 6/2006 | Wolford | ............... | H05K 1/0272 |
| | | | | 361/695 |
| 2008/0007912 A1* | 1/2008 | Matsushima | ........ | G11B 33/142 |
| 2022/0350380 A1* | 11/2022 | Tang | .................... | H05K 7/1489 |

OTHER PUBLICATIONS

TW Search Report for Application No. 111126664, dated Dec. 2, 2022, w/ First Office Action.

* cited by examiner

HIGH EFFICIENCY JET FLOW GENERATOR FOR STORAGE COOLING

CROSS REFERENCE TO RELATED APPLICATIONS

This application claims priority under 35 U.S.C. § 119 to U.S. Provisional Application No. 63/314,691, titled "HIGH EFFICIENCY JET FLOW GENERATOR FOR STORAGE COOLING," and filed on Feb. 28, 2022. The contents of that application are hereby incorporated by reference in their entirety.

TECHNICAL FIELD

The present disclosure relates to computing systems generally and more specifically, to thermal control in storage chassis.

BACKGROUND

Computing systems often involve computer chassis having many heat-generating components within. During operation, management of heat can be an important and difficult task, especially when heat-generating components are densely packed together, as may be desired to minimize required footprint.

To meet the demands of providing more computer power, higher computer speeds, and/or larger storage quantities, computer chassis may be designed with more heat-generating components placed in smaller spaces, and heat-generating components may themselves generate more hear during use.

There is a need for improved thermal management within computer chassis.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, supplemented by this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include a computer chassis comprising one or more chassis walls defining an airspace having an air inlet and an air outlet. The computer chassis further comprises a printed circuit board (PCB) layer positioned within the airspace to split the airspace into a first region and a second region. The PCB layer includes a plurality of connectors for receiving a plurality of heat-generating components in the first region. The PCB layer includes a forward end adjacent the air inlet and a rearward end adjacent the air outlet. The PCB layer includes at least one air opening positioned between the forward end and the rearward end to permit the passage of air between the second region and the first region. The computer chassis further comprises at least one baffle positioned in the second region adjacent the at least one air opening.

Embodiments of the present disclosure include a method comprising providing a computer chassis as described above. The method further comprises receiving air into the first region and the second region via the air inlet. Air received into the first region via the air inlet is first input air and air received into the second region via the air inlet is second input air. The method further comprises passing the first input air past at least a first portion of the plurality of heat-generating components to heat the first input air. The method further comprises passing the second input air into the first region via the at least one air opening, wherein passing the second input air into the first region via the at least one air opening results in passing the second input air past at least a second portion of the plurality of heat-generating components to heat up the second input air.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
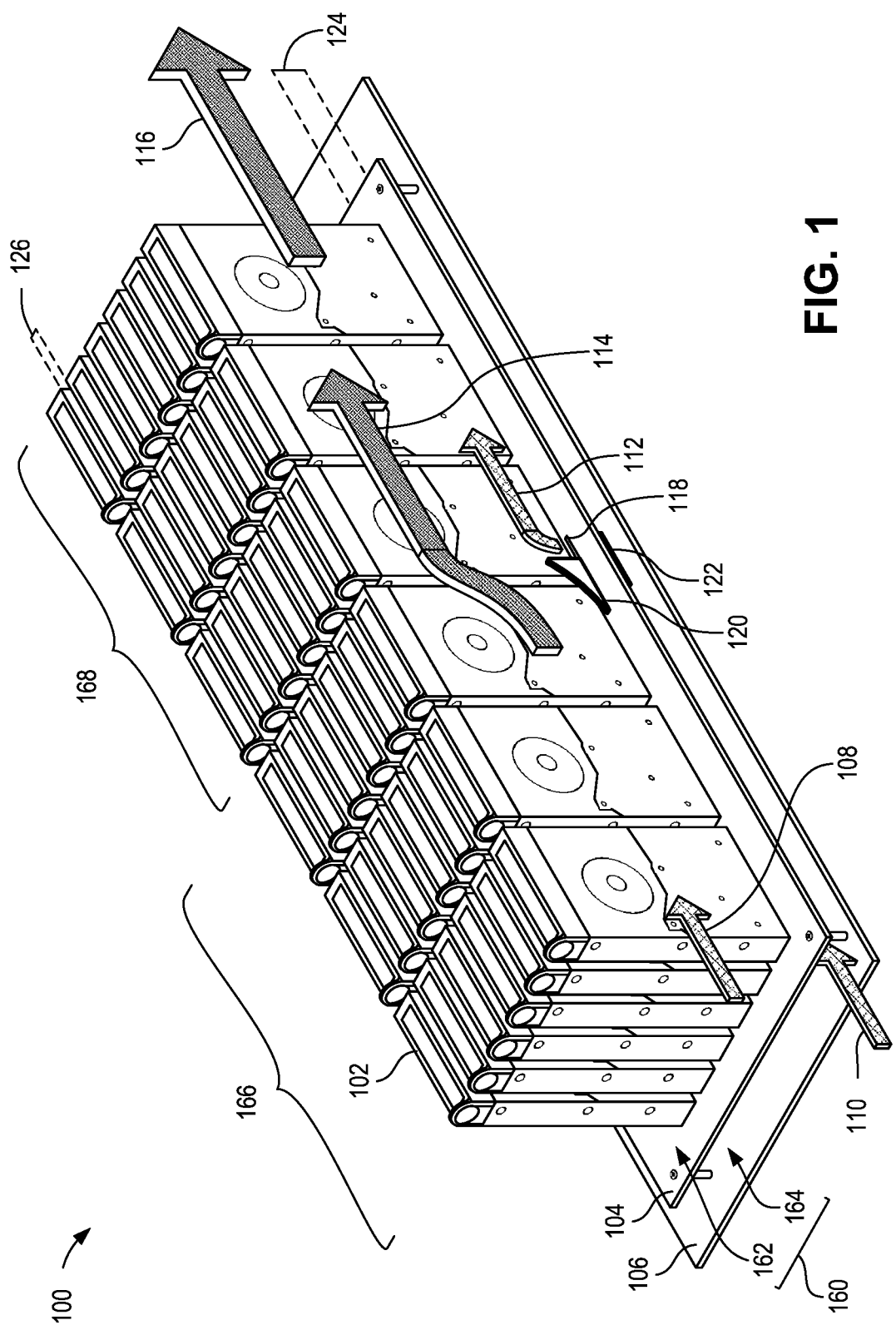
FIG. 1 is an axonometric projection of a computer chassis according to certain aspects of the present disclosure.

Certain aspects and features of the present disclosure relate to a computer chassis that includes walls defining an airspace containing heat-generating components (e.g., storage drives). The airspace is divided into first and second regions, such as by a printed circuit board supporting the heat-generating components within the first region. An air input feeds both the first region and second region. Input air going through the first region first passes by a forward set of heat-generating components before continuing to a rearward set of heat-generating components to extract heat therefrom. Input air going through the second region bypasses the forward set of heat-generating components before being directed out through an air opening partway down the length of the chassis, after which this air passes by a rearward set of heat-generating components to extract heat.

A computer chassis can include a number of walls, including a number of side walls, a lower wall (e.g., a floor), and an upper wall (e.g., a ceiling). An airspace can be defined within these walls. The airspace is a region through which air may pass within the computer chassis. Generally, air passes within the airspace from an air inlet to an air outlet. In an example, a computing system may be a rackmounted computing system having an air inlet on a front face of the chassis and an air outlet on a rear face of the chassis. A fan may be placed inline with the airspace to urge air through the airspace from the air inlet to the air outlet. For example, a fan may be placed in front of the air inlet to push air into the airspace, within the airspace to pull air in from the air inlet and push air out of the air outlet, or after the air outlet to pull air through the airspace. Other configurations may be used.

A computer chassis can include a number of heat-generating components, such as storage devices. Each heat-generating component can generate heat that must be managed to avoid overheating of itself or other components within the computer chassis. Generally, heat is managed by passing air past surfaces of the heat-generating component, which allows heat to be absorbed by the passing air, thus heating the air and cooling the heat-generating component.

In prior computer chassis, air is typically pulled into the airspace from the air inlet, passes over heat-generating components within the airspace, and exits the air outlet. When a computer chassis contains multiple heat-generating components in sequence between the air inlet and the air outlet, the air passing over the heat-generating components first passes the first heat-generating component before passing the second heat-generating component. Thus, by the time the air reaches the second heat-generating component, it has already been partially heated due to passing the first heat-generating component, and thus is less efficient at absorbing heat from the second heat-generating component. Thus, significant design limitations exist when the number of heat-generating components in sequence increases.

Heat-generating components can be installed within a chassis in various arrangements. In some cases, heat-generating components are arranged in grid-like arrangements, such as a 6×6 arrangement of 36 heat-generating components arranged in six columns each having six rows. As used herein, the term column with respect to an arrangement of heat-generating components can indicate a set of multiple heat-generating components aligned sequentially between the air inlet and the air outlet. As used herein, the term row with respect to an arrangement of heat-generating components can indicate a set of multiple heat-generating components aligned in parallel at the same or substantially the same distance from the air inlet and the air outlet.

According to certain aspects and features of the present disclosure, a computer chassis can include an airspace divided into a first region and a second region. Air entering the first region can pass past a first set of heat-generating components before continuing to the air outlet. Air entering the second region can bypass the first set of heat-generating components before passing past a second set of heat-generating components on its way to the air outlet. Thus, when the second set of heat-generating components is located "downstream" of the first set of heat-generating components, it can still be effectively cooled by air that has bypassed the first set of heat-generating components, without necessarily needing to be cooled by only air that has already passed past the first set of heat-generating components. In some cases, the air passing the first set of heat-generating components may also pass the second set of heat-generating components, although that need not always be the case. In some cases, the air passing the first set of heat-generating components may be directed out of the airspace before passing the second set of heat-generating components. In some cases, the air passing the first set of heat-generating components may be directed to a top portion of the airspace while passing the second set of heat-generating components.

In some cases, the first region can be located above the second region, although that need not always be the case. For example, in some cases a first region may be located to the side of a second region, such as when separated by an inner wall.

In some cases, the first region is separated from the second region by a printed circuit board (PCB), such as a PCB supporting the multiple heat-generating components. For example, when the heat-generating components are storage devices (e.g., hard drives), the PCB can be a PCB with connectors for connecting the storage devices. Such a PCB can be used to facilitate communication with the storage devices, such as a hard drive controller board.

Air passing into the second region can be directed into the airspace through one or more air openings in the structure separating the first region from the second region, such as air openings in the PCB. Air passing into the second region can be directed through the air openings via one or more baffles. In some cases, each baffle is configured to accelerate the air so that it passes out of the air opening(s) at a higher velocity than entering the baffle. Such a baffle configuration can be known as a flow generator. In some cases, the walls of the baffle include one or more incident surfaces having a shape defined by a quadratic curve. The cross-sectional area of an input to a baffle may be larger than the cross-sectional area of the air opening through which the air passes into the first region.

The air openings can be located at any suitable location along the longitudinal length of the chassis. In some cases, however, the air opening is located approximately at a halfway point between the air inlet and the air outlet, or approximately at a halfway point between a forward end of the PCB (e.g., an end nearest the air inlet) and a rearward end of the PCB (e.g., an end nearest the air outlet). In some cases, a location approximately at a halfway point between two points includes being located at 50%, between 45%-55%, between 40%-60%, or between 35%-65% of the distance between the two points. In some cases, multiple air openings can be used at different longitudinal locations in the chassis, such as to provide three or more airflows. For example, when three airflows are provided, a first airflow may initially pass past a first set of heat-generating components, a second airflow may bypass the first set of heat-generating components before passing past a second set of heat-generating components, and a third airflow may bypass both the first and second sets of heat-generating components before passing past a third set of heat-generating components. As used herein, airflow passing past a heat-generating component includes the air absorbing heat from the heat-generating component, thus cooling the heat-generating component via convection. Airflow bypassing a heat-generating component includes flowing in a fashion such that it does not directly absorb heat from the heat-generating component via convection, such as air flowing on the opposite side of an inner wall (e.g., a PCB layer) from the heat-generating component.

In some cases, a secondary baffle can be positioned within the first region, such as immediately upstream of the air opening (e.g., between the air inlet and the air opening). The secondary baffle can cause air that has passed a first set of heat-generating components in the first region to be urged away from the air opening. In some cases, such a secondary baffle can have one or more incident surfaces having a shape defined by a quadratic curve. In some cases, a secondary baffle located between adjacent heat-generating components in a row can be shaped to occupy at least 50%, 60%, 70%, 80%, 90%, or 95% of the width between the adjacent heat-generating components.

Certain aspects of the present disclosure can be especially useful in thermal management of computer chassis containing multiple storage devices, such as multiple hard drives. In such computer chassis, the use of multiple storage devices in a close arrangement can generate substantial heat that may be difficult to manage, especially when numerous storage devices are arranged in columns (e.g., arranged sequentially between the air inlet and the air outlet).

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative embodiments but, like the illustrative embodiments, should not be used to limit the present disclosure. The elements included in the illustrations herein may not be drawn to scale.

FIG. 1 is an axonometric projection of a computer chassis 100 according to certain aspects of the present disclosure. For illustrative purposes, most walls, the air inlet, and the air outlet of the chassis 100 are not depicted. However, the chassis 100 can include one or more walls that define an airspace 160, an air inlet for letting air into the airspace 160, and an air outlet for letting air out of the airspace 160. In some cases, each of the air inlet and/or air outlet can be a single opening or multiple openings (e.g., multiple openings in the front face of a chassis 100 functioning together as an air inlet). The airspace 160 fluidly couples the air inlet to the air outlet.

The chassis 100 can include a floor 106 (e.g., a lower wall) that extends from a front end of the chassis 100 to a rear end of the chassis 100. As depicted in FIG. 1, the front end may be towards the bottom-left while the rear end may be towards the top right, although that need not always be the case. The direction between the front end and the rear end can be known as the longitudinal direction. The lateral direction can be a direction perpendicular to the longitudinal direction and parallel the floor 106.

A PCB 104 can be supported by the floor 106 and spaced apart from the floor 106 by a gap 124. The PCB 104 can be supported via a set of coupling devices with spacers (e.g., screws securing the PCB 104 to spacers, which are secured to the floor 106). Other coupling mechanisms can be used. The PCB 104 can effectively separate the airspace 160 into a first region 162 and a second region 164. In some cases, structures other than a PCB 104 (e.g., an inner wall) can be used in addition to or instead of the PCB 104 to separate the airspace 160 into the first region 162 and the second region 164. The first region 162 can be located above the second region 164, such that as air within the first region 162 is heated, it naturally rises away from the second region 164, although this need not always be the case.

The PCB 104 can support a number of heat-generating components 102, such as a number of storage devices (e.g., hard drives). The heat-generating components 102 can be arranged in an arrangement having multiple columns each having multiple rows. As depicted, the heat-generating components 102 are storage drives having top and bottom ends (e.g., facing up and down, respectively, as depicted in FIG. 1), front and rear sides (e.g., facing towards the bottom-left and top-right of the page, respectively, as depicted in FIG. 1), and left and right faces (e.g., facing towards the top-left and bottom-right of the page, respectively, as depicted in FIG. 1). The bottom ends of each storage drive can include a connector that couples the storage drive to the PCB 104 mechanically and/or electrically. The storage drives are arranged in a 6×6 arrangement with six columns each having six rows. The storage drives are arranged in columns with front and rear sides adjacent one another, except for those at the ends of the column. The storage drives are arranged in rows with left and right faces adjacent one another, except for those at the ends of the row.

First airflow 108 is depicted entering the first region 162 of the airspace 160 from an air inlet. First airflow 108 passes past a first set of heat-generating components 166, extracting heat from the first set of heat-generating components 166. This first airflow continues into the second set of heat-generating components 168 as first continued airflow 114, before exiting the airspace 160 as exit airflow 116.

Second airflow 110 is depicted entering the second region 164 of the airspace 160 from an air inlet (e.g., the same air inlet as first airflow 108). Second airflow 110 bypasses the first set of heat-generating components 166 by flowing within the gap 124 between the PCB 104 and the floor 106. Second airflow 110 then reaches the baffle 122 where it is then directed up and in to the air opening 118. The second airflow 110, after passing through the air opening 118, continues past the second set of heat-generating components 168 as second continued airflow 112, before exiting the airspace 160 as exit airflow 116.

In some cases, a supplemental secondary baffle 120 can be coupled to the PCB 104 to redirect the first airflow 108 away from the air opening 118 (e.g., redirect the first airflow 108 up towards the top of the chassis 100). Thus, the first continued airflow 114 can pass above the second continued airflow 112, allowing the second continued airflow 112 to better cool the second set of heat-generating components 168.

In some cases, the baffle 122 can be a flow generator designed to increase the velocity of the second airflow 110 as it approaches and exits the air opening 118, thus resulting in a faster second continued airflow 112. This increase in velocity of the second continued airflow 112 further facilitates extracting heat from the second set of heat-generating components 168, such as by further urging the first continued airflow 114 out of the way (e.g., towards the top of the chassis 100).

The air opening 118 can be an opening in the PCB 104. In some cases, air opening 118 can be a slit-like opening, although other shapes can be used. In some cases, the air opening 118 can have a width designed to occupy at least 50%, 55%, 60%, 65%, 70%, 75%, 80%, 85%, 90%, or 95% of the space between the adjacent heat-generating device on one side and another structure on the other side (e.g., another adjacent heat-generating device or a chassis wall).

The baffle 122 can be designed such that it in combination with other baffles in the second region 164 can occupy the full width of the second region 164 such that all of the second airflow 110 exits through the air opening 118 and any other respective air openings.

The secondary baffle 120 can have a width designed to occupy at least 50%, 55%, 60%, 65%, 70%, 75%, 80%, 85%, 90%, or 95% of the space between the adjacent heat-generating device on one side and another structure on the other side (e.g., another adjacent heat-generating device or a chassis wall).

Figure 2:
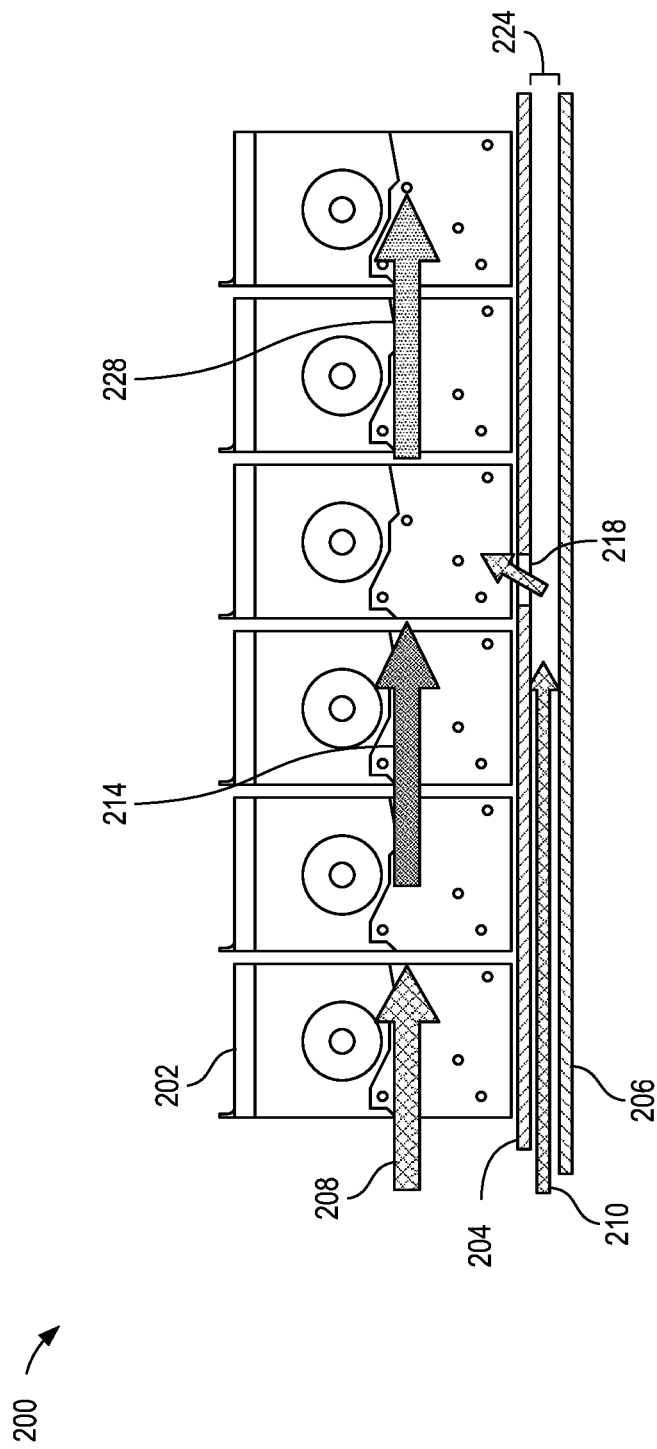
FIG. 2 is a side view of a computer chassis without a flow generator according to certain aspects of the present disclosure.

FIG. 2 is a side view of a computer chassis 200 without a flow generator according to certain aspects of the present disclosure. The chassis 200 can be similar to chassis 100 of FIG. 1, without the use of an air baffle or secondary air baffle.

As first airflow 208 enters the first region of the airspace, it sequentially passes by multiple heat-generating components 202 (e.g., storage devices, such as hard drives) in series. After passing the first one or more heat-generating components, the first airflow 208 becomes a heated airflow 214. Because the temperature differential between the heat-generating components 202 and the heated airflow 214 is less than the temperature differential between the heat-generating components 202 and the first airflow 208, the heated airflow 214 is unable to extract heat from the heat-generating components 202 as efficiently.

A second airflow 210 can enter the second region of the airspace located in the gap 224 between the floor 206 and the PCB 204. The second airflow 210 can continue flowing until it exits through an air opening 218 into the first region and merges with the heated airflow 214 to create a combined airflow 228. This combined airflow 228 then passes past additional heat-generating components 202, extracting heat from those heat-generating components 202. The mixture between the cooler second airflow 210 and heated airflow 214 brings the overall temperature of the combined 228 airflow lower than just the heated airflow 214 alone, permitting improved heat extraction from the additional heat-generating components 202.

Figure 3:
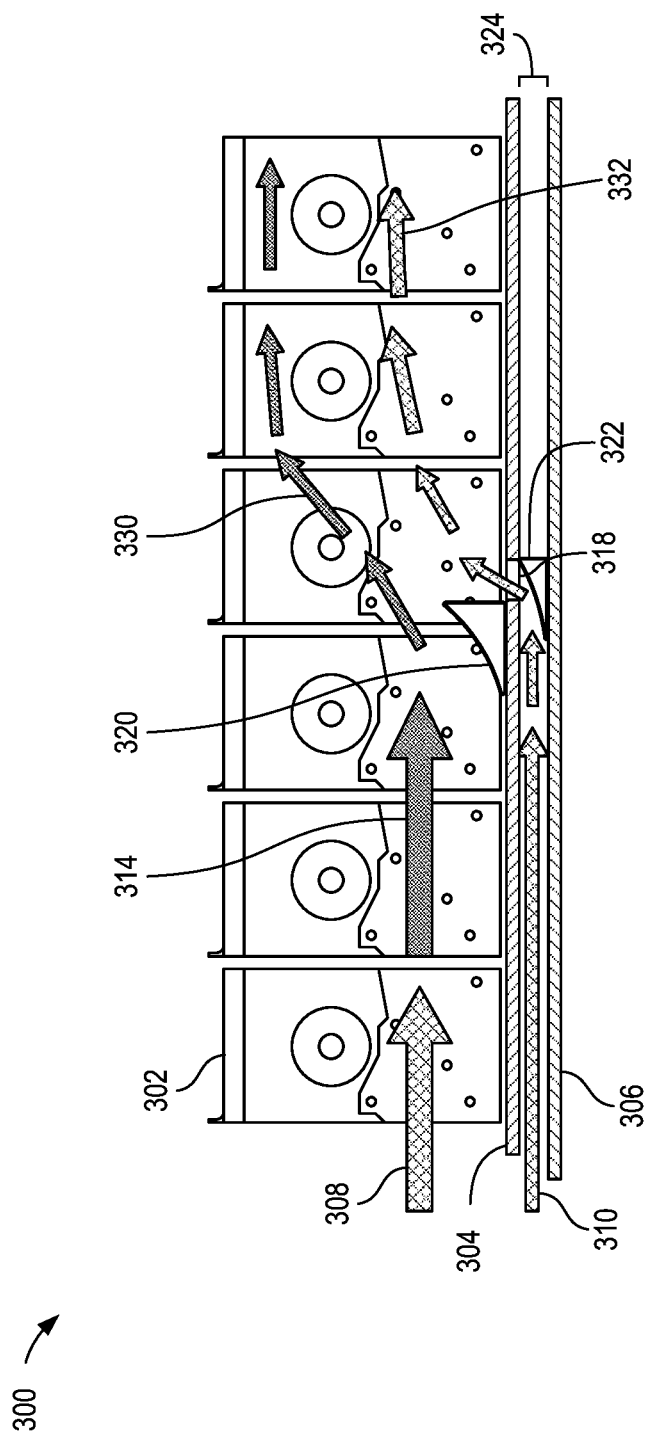
FIG. 3 is a side view of a computer chassis with a flow generator and a secondary baffle according to certain aspects of the present disclosure.

FIG. 3 is a side view of a computer chassis 300 with a flow generator 322 and a secondary baffle 320 according to certain aspects of the present disclosure. The chassis 300 can be the chassis 100 of FIG. 1.

First airflow 308 enters the first region of the airspace, sequentially passing by multiple heat-generating components 302 (e.g., storage devices, such as hard drives) in series. After passing the first one or more heat-generating components 302, the first airflow 308 becomes a heated airflow 314. Because the temperature differential between the heat-generating components 302 and the heated airflow 314 is less than the temperature differential between the heat-generating components 302 and the first airflow 308, the heated airflow 314 is unable to extract heat from the heat-generating components 302 as efficiently.

A second airflow 310 can enter the second region of the airspace located in the gap 324 between the floor 306 and the PCB 304. The second airflow 310 can continue flowing until it exits through an air opening 318 into the first region.

Unlike the chassis 200 of FIG. 2, the use of flow generators 322 and secondary baffles 320 further improve the thermal regulation of the heat-generating components 302 located downstream of the air openings 318.

As the heated airflow 314 reaches the air openings 318, secondary baffles 320 urge the heated airflow 314 upwards and away from the air openings 318. This redirected heated airflow 314 is continuing heated airflow 330. The continuing heated airflow 330 can thereafter pass the remaining heat-generating components 302 at a location near the top of the chassis 300, such as near the top of the heat-generating components 302.

As the second airflow 310 reaches the air opening 318, it can pass through a flow generator 322 (e.g., baffle 122 to FIG. 1) designed to direct the second airflow 310 through the air opening 318 while increasing the velocity of the second airflow 310. The flow generator 322 can be shaped to achieve this increase in velocity, such as by accepting second airflow 310 via cross-sectional area that is wider than the cross-sectional area of the air opening 318. The flow generator 322 can be shaped to reduce and/or minimize drag, such as by having one or more impinging surfaces whose shapes are defined by a quadratic curve.

As second airflow 310 exits the air opening 318 at a higher velocity, it can facilitate moving the continuing heated airflow 330 towards the top of the chassis 300, thus permitting more of the second airflow 310 to extract heat from the heat-generating components 302 as a second continuing airflow 332. The increased velocity can further resist mixing of the continuing heated airflow 330 and second continuing airflow 332 to facilitate the second continuing airflow 332 extracting heat from the heat-generating components 302 more efficiently than if the continuing heated airflow 330 and second continuing airflow 332 had mixed more.

In some cases, the location and/or configuration of the flow generators 322, air openings 318, and/or secondary baffles 320 can be positioned to specifically focus airflow over certain regions of the heat-generating components 302.

Further, in some cases, heat-generating components 302 can be arranged in the chassis 300 such that the regions of highest heat generation, regions of lowest heat tolerance, and/or regions of highest importance are located nearest the PCB 304, and thus able to be cooled primarily by the second continuing airflow 332 rather than the continuing heated airflow 330.

Figure 4:
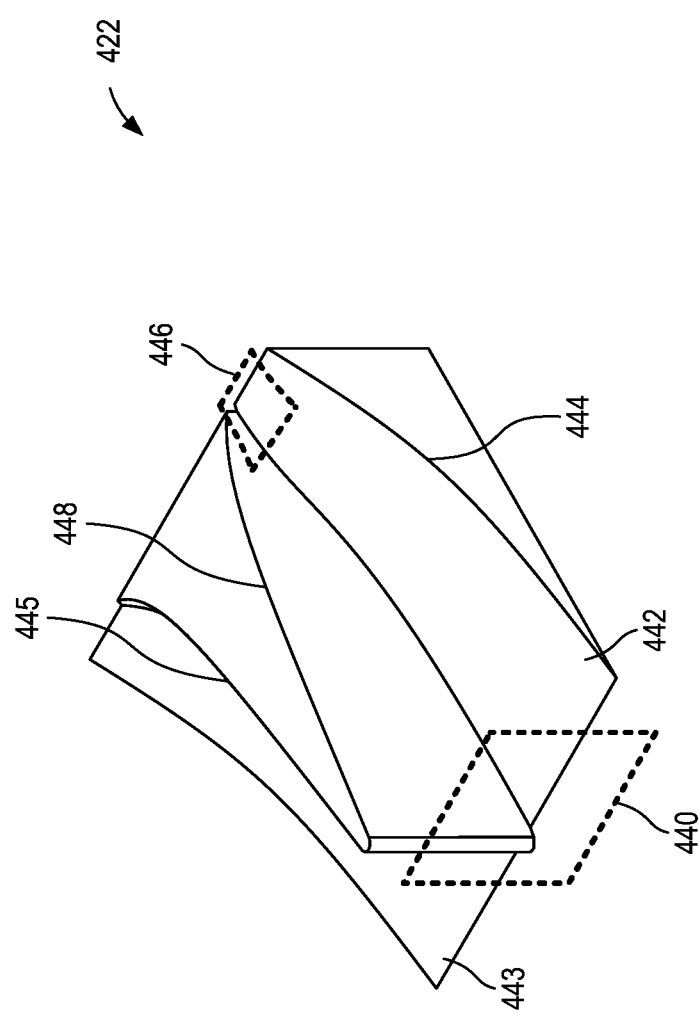
FIG. 4 is an axonometric projection of a flow generator according to certain aspects of the present disclosure.

FIG. 4 is an axonometric projection of a flow generator 422 according to certain aspects of the present disclosure. Flow generator 422 can be any suitable flow generator, such as baffle 122 of FIG. 1 or flow generator 322 of FIG. 3. For illustrative purposes, portions of two flow generators 422 are depicted in FIG. 4, including a nearer flow generator 422 and a further flow generator. In some cases, a flow generator 422 can be an individual, separate component. However, in other cases, such as seen in FIG. 4, the flow generator 422 can be part of a set of flow generators 422 formed together or otherwise coupled together.

Flow generator 422 can include a set of incident surfaces, including a first incident surface 442 (e.g., connecting the floor of the chassis to the air opening), a second incident surface 448 (e.g., a leftmost incident surface of the flow generator 422), and a third incident surface 444 (e.g., a rightmost incident surface of the flow generator 422). For illustrative purposes, the first incident surface 442 and third incident surface 444 of the nearer flow generator 422 can be equivalent to the first incident surface 443 and third incident surface 445 of the further flow generator, respectively.

Each of the incident surfaces 442, 444, 448 of a flow generator 442 can define a passage through which airflow will pass to exit out an air opening (e.g., air opening 118 of FIG. 1). In some cases, this passage can be further defined by an upper incident surface, which can be a component of the flow generator 442 or can be a lower surface of the component above the flow generator 442 (e.g., the PCB, such as PCB 104 of FIG. 1).

One, some, or all of these incident surfaces can be shaped to facilitate airflow and reduce drag. In an example, one, some, or all of these incident surfaces can have a shape defined by a quadratic curve (e.g., a shape that has a surface or edge that is a portion of a quadratic curve or is otherwise defined by a quadratic equation).

Each flow generator 442 can have an input cross-sectional area 440 and an output cross-sectional area 446. The input cross-sectional area 440 is larger than the output cross-sectional area 446, thus increasing the velocity of airflow as it passes through the flow generator 422. In some cases, the input cross-sectional area 440 is the same height as the gap (e.g., gap 124 of FIG. 1) between the floor of the chassis and the structure separating the first region and the second region of the airspace. In some cases, the output cross-sectional area 446 is the same or approximately the same as the cross-sectional area of the air opening (e.g., air opening 118 of FIG. 1).

Figure 5:
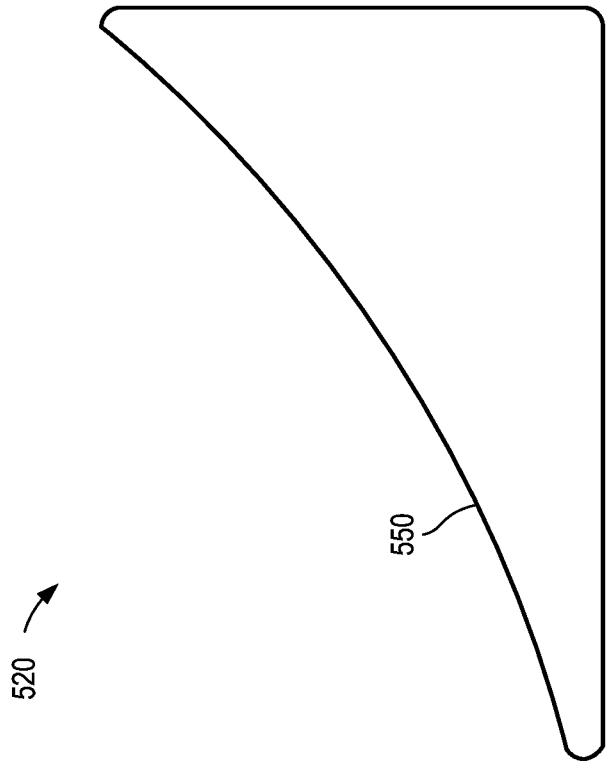
FIG. 5 is a side view of a secondary baffle according to certain aspects of the present disclosure.

FIG. 5 is a side view of a secondary baffle 520 according to certain aspects of the present disclosure. Secondary baffle 520 can be any suitable secondary baffle, such as secondary baffle 120 of FIG. 1.

The secondary baffle 520 can be shaped to rest on a surface, such as a top surface of the PCB (e.g., PCB 104 of FIG. 1) and redirect incoming air up and away from the surface upon which it is resting. The secondary baffle 520 can include an incident surface 550 that is shaped to urge incoming air (e.g., incoming from the left of the page in FIG. 5) up and away from the surface upon which it is resting. In some cases, the curve of the incident surface 550 can be defined by a quadratic curve.

Figure 6:
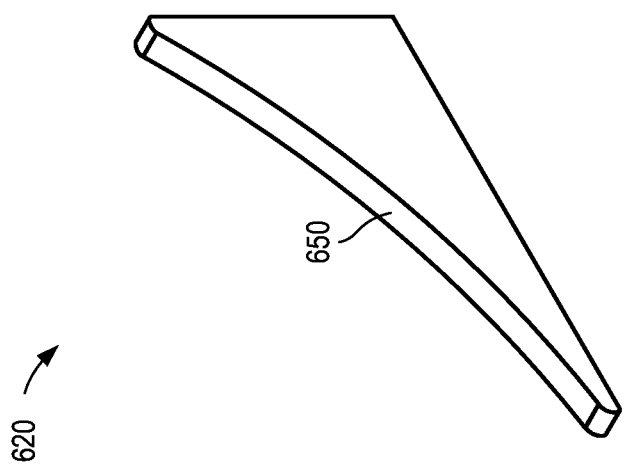
FIG. 6 is an axonometric projection of a secondary baffle according to certain aspects of the present disclosure.

FIG. 6 is an axonometric projection of a secondary baffle 620 according to certain aspects of the present disclosure. Secondary baffle 620 can be secondary baffle 520 of FIG. 5.

The secondary baffle 620 can have any suitable width. In some cases, the width of the secondary baffle 620 is constant across its length, providing a uniform fit between a heat-generating component and an adjacent component (e.g., another adjacent heat-generating component or a chassis wall). In some cases, however, the width of the secondary baffle 620 can vary along its length, such as to match varying walls within the computer chassis. The secondary baffle 620 can include an incident surface 650 that is shaped to urge incoming air (e.g., incoming from the left of the page in FIG. 6) up and away from the surface upon which it is resting.

Figure 7:
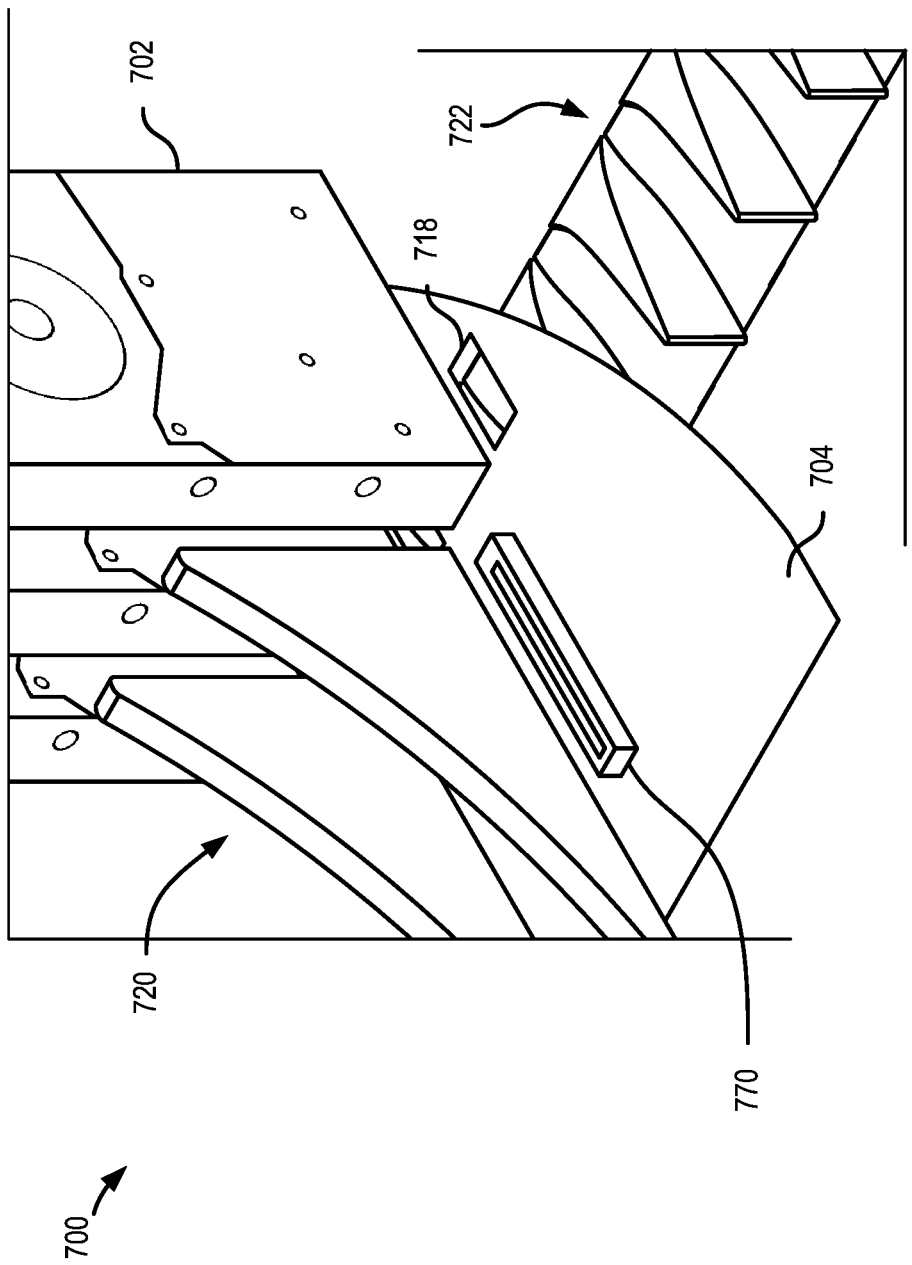
FIG. 7 is a cutaway axonometric projection of a portion of a computer chassis depicting a row of flow generators according to certain aspects of the present disclosure.

FIG. 7 is a cutaway axonometric projection of a portion of a computer chassis 700 depicting a row of flow generators 722 according to certain aspects of the present disclosure. Computer chassis 700 can be computer chassis 100 of FIG. 1. For illustrative purposes, various components of the computer chassis 700 are shown in partial cutaway or removed to show parts underneath.

The chassis 700 can include many rows of heat-generating components 702. A single row is depicted in FIG. 7. Each heat-generating component 702 is coupled to a PCB 704, such as by a connector 770 coupled to the PCB 704. A row of secondary baffles 720 can be coupled to the PCB 704 or otherwise positioned between heat-generating components 702 (e.g., between the non-visible heat-generating components as depicted in FIG. 7). A row of air openings 718 can be located just downstream of the row of secondary baffles 720. Under the PCB 704, a row of flow generators 722 can be positioned to direct air up and through the air openings 718.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art. Numerous changes to the disclosed embodiments can be made in accordance with the disclosure herein, without departing from the spirit or scope of the disclosure. Thus, the breadth and scope of the present disclosure should not be limited by any of the above described embodiments.

Although certain aspects and features of the present disclosure have been illustrated and described with respect to one or more implementations, equivalent alterations and modifications will occur or be known to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

One or more elements or aspects or steps, or any portion(s) thereof, from one or more of any of claims 1 to 20 below can be combined with one or more elements or aspects or steps, or any portion(s) thereof, from one or more of any of the other claims 1 to 20 or combinations thereof, to form one or more additional implementations and/or claims of the present disclosure.

What is claimed is:

1. A computer chassis, comprising:
   one or more chassis walls defining an airspace having an air inlet and an air outlet;
   a printed circuit board (PCB) layer positioned within the airspace to split the airspace into a first region and a second region, the PCB layer having a plurality of connectors for receiving a plurality of heat-generating components in the first region, the PCB layer having a forward end adjacent the air inlet and a rearward end adjacent the air outlet, the PCB layer having at least one air opening positioned between the forward end and the rearward end to permit the passage of air between the second region and the first region; and
   at least one baffle having an input, an output, and a first curved incident surface and a second curved incident surface interposed between the input and output, wherein the output is positioned in the second region adjacent the at least one air opening, wherein a cross section area of the input is larger than a cross section area of the output.

2. The computer chassis of claim 1, wherein the PCB layer is a PCB for supporting a plurality of storage devices, wherein each of the plurality of heat-generating components is one of the plurality of storage devices.

3. The computer chassis of claim 1, wherein the one or more chassis walls include at least a floor, wherein the at least one baffle is coupled to the floor, and wherein the first region is located above the second region.

4. The computer chassis of claim 1, further comprising at least one secondary baffle positioned in the first region adjacent the at least one air opening at a position between the forward end and the at least one air opening, wherein the at least one secondary baffle is shaped with a curved incident surface to direct air from the air inlet away from the at least one air opening.

5. The computer chassis of claim 1, wherein the at least one baffle is shaped to direct air from the air inlet into the first region via the at least one air opening.

6. The computer chassis of claim 1, wherein the plurality of connectors include at least a row of connectors aligned in a lateral direction, wherein the lateral direction is perpendicular to a longitudinal direction between the air inlet and the air outlet, wherein the at least one air opening includes a row of air openings aligned in the lateral direction, and wherein the at least one baffle includes a row of baffles aligned in the lateral direction.

7. The computer chassis of claim 6, further comprising a row of secondary baffles aligned in a lateral direction, wherein each secondary baffle of the row of secondary baffles is positioned in the first region adjacent a respective one of the at least one air opening at a position between the forward end and the respective one of the at least one air opening, and wherein each secondary baffle of the row of secondary baffles is shaped to direct air from the air inlet away from a respective one of the at least one air opening.

8. The computer chassis of claim 1, wherein each of the at least one baffle interacts with respective ones of the at least one air opening to form an acceleration region to accelerate air flowing from the second region to the first region through the air opening.

9. The computer chassis of claim 8, wherein the first curved incident surface and the second curved incident surface are surfaces having a shape defined by a quadratic curve.

10. The computer chassis of claim 1, wherein the at least one air opening is positioned between 40% and 60% of the distance from the forward end to the rearward end.

11. A method, comprising:
providing a computer chassis having:
one or more chassis walls defining an airspace having an air inlet and an air outlet;
a printed circuit board (PCB) layer positioned within the airspace to split the airspace into a first region and a second region, the PCB layer having a plurality of connectors for receiving a plurality of heat-generating components in the first region, the PCB layer having a forward end adjacent the air inlet and a rearward end adjacent the air outlet, the PCB layer having at least one air opening positioned between the forward end and the rearward end to permit passage of air between the second region and the first region; and
at least one baffle having an input, an output, and a first curved incident surface and a second curved incident surface interposed between the input and output, wherein the output is positioned in the second region adjacent the at least one air opening, wherein a cross section area of the input is larger than a cross section area of the output;
receiving air into the first region and the second region via the air inlet, wherein air received into the first region via the air inlet is first input air and air received into the second region via the air inlet is second input air;
passing the first input air past at least a first portion of the plurality of heat-generating components to heat the first input air;
passing the second input air into the first region via the at least one air opening, wherein passing the second input air into the first region via the at least one air opening results in passing the second input air past at least a second portion of the plurality of heat-generating components to heat up the second input air.

12. The method of claim 11, wherein the PCB layer is a PCB for supporting a plurality of storage devices, wherein each of the plurality of heat-generating components is one of the plurality of storage devices.

13. The method of claim 11, wherein the one or more chassis walls include at least a floor, wherein the at least one baffle is coupled to the floor, and wherein the first region is located above the second region.

14. The method of claim 11, wherein the computer chassis includes at least one secondary baffle positioned in the first region adjacent the at least one air opening at a position between the forward end and the at least one air opening, wherein passing the first input air past at least the first portion of the plurality of heat-generating components includes redirecting the first input air away from the at least one air opening by the at least one secondary baffle, and wherein the at least one secondary baffle is shaped with a curved incident surface to direct air from the air inlet away from the at least one air opening.

15. The method of claim 11, wherein the at least one baffle is shaped to direct air from the air inlet into the first region via the at least one air opening.

16. The method of claim 11, wherein the plurality of connectors include at least a row of connectors aligned in a lateral direction, wherein the lateral direction is perpendicular to a longitudinal direction between the air inlet and the air outlet, wherein the at least one air opening includes a row of air openings aligned in the lateral direction, wherein the at least one baffle includes a row of baffles aligned in the lateral direction, and wherein passing the second input air into the first region includes passing the second input air into the first region through the row of air openings, using the row of baffles.

17. The method of claim 16, wherein the chassis includes a row of secondary baffles aligned in a lateral direction, wherein each secondary baffle of the row of secondary baffles is positioned in the first region adjacent a respective one of the at least one air opening at a position between the forward end and the respective one of the at least one air opening, and wherein each secondary baffle of the row of secondary baffles is shaped to direct air from the air inlet away from a respective one of the at least one air opening, wherein passing the first input air past at least the first portion of the plurality of heat-generating components includes redirecting the first input air away from the row of air openings by the row of secondary baffles.

18. The method of claim 11, wherein passing the second input air into the first region includes accelerating the second input air while passing the second input air through the at least one air opening.

19. The method of claim 18, wherein the first curved incident surface and the second curved incident surface are surfaces having a shape defined by a quadratic curve.

20. The method of claim 11, wherein the at least one air opening is positioned between 40% and 60% of the distance from the forward end to the rearward end.

* * * * *